United States Patent [19]

Vydyanath

[11] Patent Number: 5,767,533
[45] Date of Patent: Jun. 16, 1998

[54] HIGH-CONDUCTIVITY SEMICONDUCTOR MATERIAL HAVING A DOPANT COMPRISING COULOMBIC PAIRS OF ELEMENTS

[76] Inventor: Honnavalli R. Vydyanath, 21832 Seacrest Lane, Hunting Beach, Calif. 92646

[21] Appl. No.: 646,628

[22] Filed: May 8, 1996

[51] Int. Cl.$^6$ .................................................. H01L 33/00
[52] U.S. Cl. .............................. 257/87; 257/101; 257/102; 257/103
[58] Field of Search .............................. 257/87, 101, 102, 257/103

[56] References Cited

U.S. PATENT DOCUMENTS 5,578,839  11/1996  Nakamuran et al. .................. 257/101

OTHER PUBLICATIONS

Journal of Applied Physics, 49, 5928 (1978) by H.R. Vydyanath; J.S. Lorenzo; and F.A. Kroger, "Defect Pairing Diffusion, And Solubility Studies In Selenium Doped Silicon" no month.

Primary Examiner—Minh-Loan Tran
Attorney, Agent, or Firm—Leonard Tachner

[57] ABSTRACT

A method of providing shallow acceptor and donor energy levels to produce higher conductivity semiconductor materials, relies on the coulombic pairing of donor and acceptor elements. One exemplary embodiment is applied to create shallow acceptor levels in the III-V nitride materials via the coulombic pairing of group I elements which, in principle, act as double acceptors occupying metal lattice sites with group IV or group VI elements which act as single donors occupying metal or nitrogen lattice sites, respectively. The resulting pairs act as single acceptors with an energy level much closer to the valence band edge than that of either the first or second level of the group I element acceptors in their unpaired state. This approach, when optimized, can result in creating acceptor levels much shallower than the Mg acceptors currently used to make p-type GaN and its alloys.

15 Claims, 4 Drawing Sheets

HIGH-CONDUCTIVITY SEMICONDUCTOR MATERIAL HAVING A DOPANT COMPRISING COULOMBIC PAIRS OF ELEMENTS

BACKGROUND OF THE INVENTION

1. Field of the Invention

The present invention relates generally to the field of semiconductor devices and more particularly to a unique method for creating wide band gap type III-V semiconductor materials by using coulombic pairing of group I and either group IV or group VI elements to create shallow acceptor levels and high doping concentration, as well as an increase in quantum efficiency and a decrease in the contact resistance and therewith a decrease in the turn-on voltage for visible light emission devices. The method is potentially useful for creating high conductivity P-type III-V nitride materials having significant advantages over the prior art.

2. Prior Art

The III-V compound semiconducting nitrides such as Gallium Nitride (GaN), Indium Nitride (InN), and Aluminum Nitride (AlN) along with ternary and quaternary combinations of these alloys, form an extremely important class of wide band gap semiconductor materials with immense significance for applications in visible light emission, such as light emitting diodes (LEDs) and laser diodes (LDs). Other applications include detection in the ultraviolet spectral region and in high temperature electronics. The usefulness of the III-V nitrides arises from their direct energy gap, providing efficient radiative recombination and the tunability of the wavelength of the emitted radiation continuously from ultraviolet (UV) to visible corresponding to a band gap ranging from 1.0 eV for InN to 6.2 eV for AlN.

For many years, realization of the nitride-based blue LEDs had been thwarted by the inability to prepare high conductivity p-type GaN. Although high conductivity p-type GaN has been realized recently and blue LEDs with high brightness have been produced using Mg as a p-type dopant in GaN and GaInN, an alternate p-type dopant whose acceptor energy level is shallower than that of Mg is needed because the energy level of Mg in GaN appears to be unacceptably high—at 125 to 150 meV above the valence band edge and going up to 200 meV with only small additions of AlN (8%)—resulting in high device resistance and therewith an unacceptably high turn-on voltage of the lasers for stimulated emission at room temperature. Additionally, the acceptor efficiency of Mg in GaN is only on the order of $10^{-3}$ to $10^{-2}$, thereby necessitating incorporation of large amounts of Mg to obtain reasonable doping levels. It is possible that a large concentration of non-radiative recombination centers is also incorporated in this doping process.

SUMMARY OF THE INVENTION

The invention utilizes a new concept called "coulombic pairing" which entails pairing of double acceptors with a single donor to create a pair which acts as a single acceptor with an energy level that is shallower than the original acceptor in its unpaired state. Thus for example, type III-V nitrides can be simultaneously doped with an element from group I and an element from group IV or group VI under conditions which cause the group I element to occupy metal lattice sites and thus act as a double acceptor while the group IV and group VI elements occupy metal and nitrogen lattice sites respectively and act as single donors. The resulting pair acts as a single acceptor with a much lower energy level, i.e., much closer to the valence band edge of the energy band. Coulombic pairing of dopants has been applied in GaN to produce p-type material. Optimization of the pairing approach leads to much higher concentration of holes and a much higher p-type conductivity of GaN and its alloys. An increase in the quantum efficiency of the LEDs and lasers and a decrease in the turn-on voltage of the lasers for stimulated emission at room temperatures becomes feasible. Extremely improved performance in blue lasers and LEDs is anticipated.

OBJECTS OF THE INVENTION

It is therefore a principal object of the present invention to provide an improved method for fabricating type III-V nitride semiconductor materials.

It is another object of the invention to provide a new method for doping type III-V nitride semiconductor materials to improve hole concentration by reducing acceptor energy levels as compared to conventional methods.

It is still another object of the invention to provide a new method for doping type III-V nitride semiconductor materials resulting in an increase in the quantum efficiency of nitride semiconductor LEDs and lasers and a decrease in the turn-on voltage of such lasers for brighter stimulated emission at room temperature.

It is still another object of the invention to utilize coulombic pairing of dopants to achieve high-conductivity p-type GaN and related alloys.

It is still another object of the invention to utilize coulombic pairing of dopants to produce highly improved light emitting devices.

It is still another object of the invention to provide a method of doping GaN and its alloys without using Mg while achieving performance characteristics superior to Mg-doped GaN and its alloys.

BRIEF DESCRIPTION OF THE DRAWINGS

The aforementioned objects and advantages of the present invention, as well as additional objects and advantages thereof will be more fully understood hereinafter as a result of a detailed description of a preferred embodiment when taken in conjunction with the accompanying drawings in which.

DETAILED DESCRIPTION OF A PREFERRED EMBODIMENT

The coulombic pairing concept to create shallow acceptor levels in the III-V nitrides is described herein. Next, the thermodynamics of coulombic pairing is described, followed by a discussion of the demonstration of the feasibility of the coulombic pairing concept to create shallow acceptor levels in GaN. The optimization parameters are then described such as choice of dopant combinations for the coulombic pairs and conditions necessary for the maximization of the concentration of the pairs so that III-V nitrides with the shallowest acceptor levels and highest p-type conductivity can be obtained. Finally, the impact of the coulombic pairing concept via creation of acceptors at <50 meV above the valence band edge of the III-V nitrides for blue LEDs and lasers is discussed.

DESCRIPTION OF THE COULOMBIC PAIRING CONCEPT

The coulombic pairing concept for the creation of shallow acceptor levels entails pairing of a double acceptor $A^{--}$ with a single donor $D^+$ with the resulting pair $(A^{--}D^+)^-$ acting as a single acceptor with an energy level shallower than that of either $A^-$ or $A^{--}$ in their unpaired state. Specifically, the III-V nitrides will be simultaneously doped with an element from group I and an element from group IV or VI under conditions which would promote the association of the group I element occupying metal lattice sites, acting as a double acceptor, $A^{--}$, with the group IV or group VI element occupying metal or nitrogen lattice site acting as a single donor $D^+$.

Figure 1:
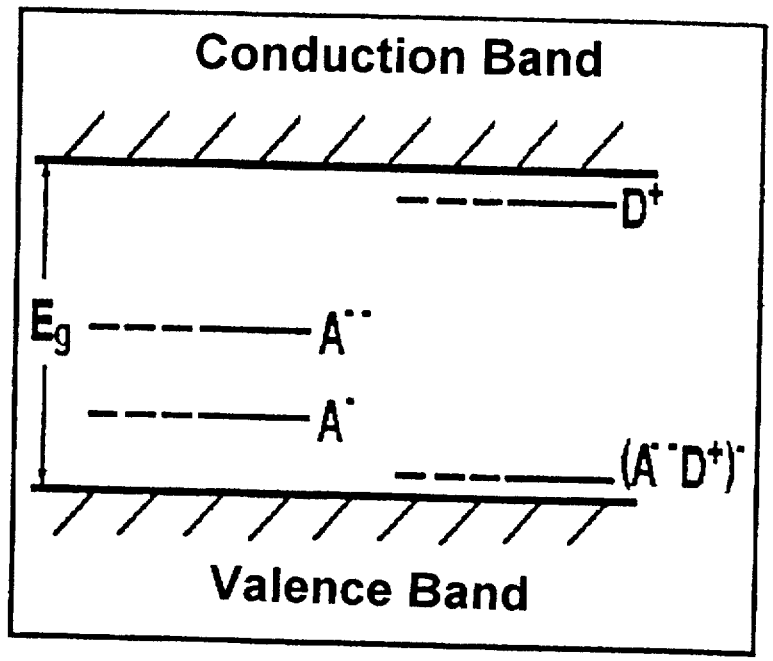
FIG. 1 is an energy band diagram illustrating energy level variations in III-V nitrides using the coulombic pairing method of the invention.

The resulting pair, $(A^{--}D^+)^-$, would act as a single acceptor with an expected energy level much closer to the valence band edge than that of either $A^-$ or $A^{--}$ in their unpaired state (FIG. 1).

It should be noted that the approach of the present invention is also elegant because the concentration of the shallow acceptors created by coulombic pairing is determined by the concentration of the Group IV or Group VI element donors in the crystals and the concentration of the Group I element acceptors need not be precisely controlled as long as it is in excess of the concentration of the Group IV or Group VI donors.

Figure 2:
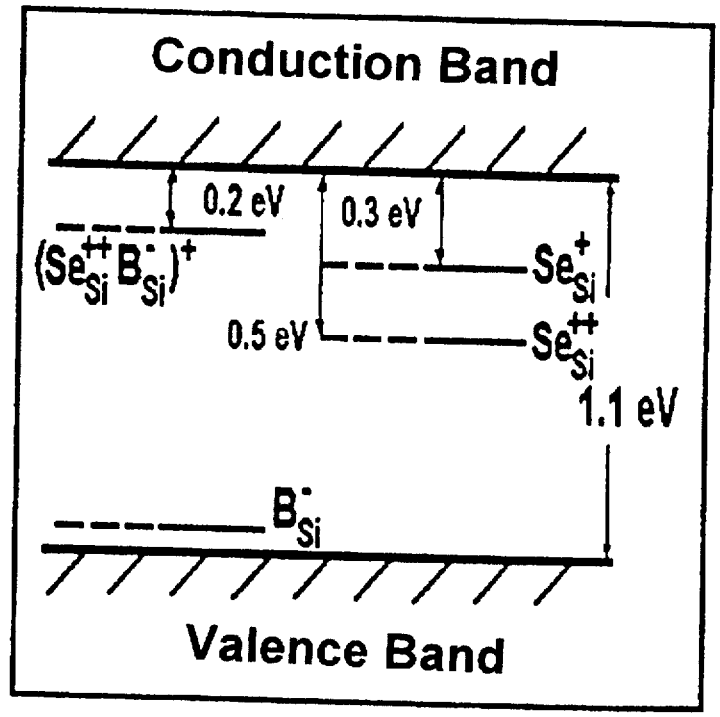
FIG. 2 is an energy band diagram illustrating energy level variations in other materials resulting from coulombic pairing.
Figure 3:
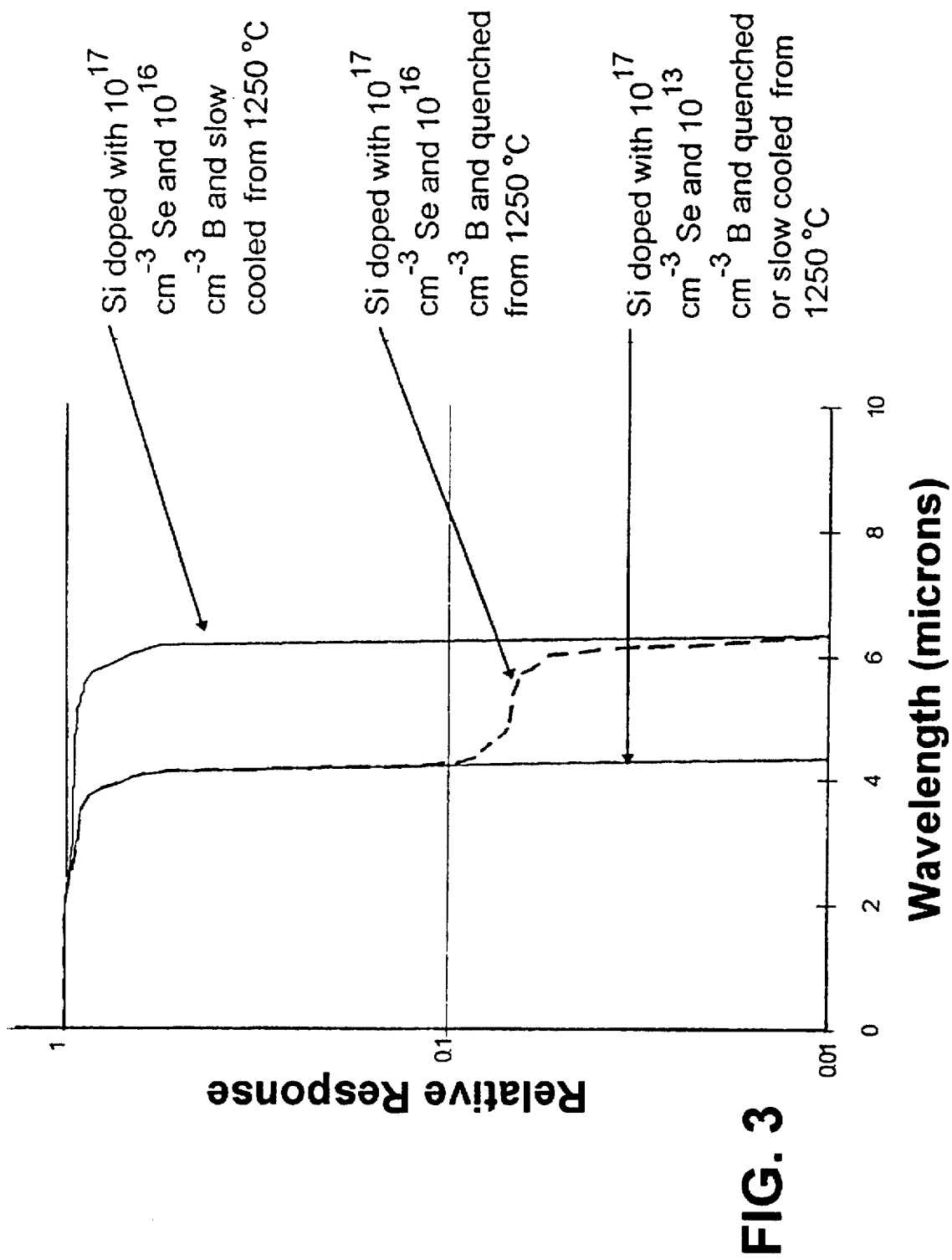
FIG. 3 is a graphical illustration showing the effect of doping by coulombic pairing on spectral response.

As shown in FIG. 2, coulombic pairing has been employed to decrease the energy level of the doubly ionized selenium from 0.5 eV to a level shallower than that of even the first level of selenium which is 0.3 eV below the conduction band edge. This approach was used successfully to fabricate selenium doped silicon photoconductors with either a 4.1 μm response or a 6.2 μm response (FIG. 3).

The concept of coulombic pairing of dopants could be envisioned to be useful in manipulating Fermi levels and therewith the electronic properties of various elemental and compound semiconductors. A variety of photonic devices which could benefit from using this approach include photoconductors, photovoltaics, LEDs, lasers, and photorefractive devices, etc.

The present invention has the potential to achieve the goal of reducing the energy level of the acceptors in GaN and its alloys with InN and/or AlN to below that of Mg, thus resulting in a large increase in the hole concentration in the cladding layers of the multiple quantum well heterostructure LEDs and lasers. An increase in the quantum efficiency of the LEDs and lasers and a decrease in the contact resistance and a decrease in the turn-on voltage of the lasers for stimulated emission at room temperature can be realized.

The coulombic pairing approach is also applicable to II-VI wideband gap semiconductors such as ZnSe and its higher band gap alloys with Zn, Mg and S, where p-type doping limitation is still an issue in the operation of blue lasers and light emitting diodes. Here, one would use a combination of elements from group III and group IV. The pairing approach would entail the promotion of concentration of elements from group III substituting Zn lattice sites acting as single donors and concentration of elements from group IV substituting Se lattice sites acting as double acceptors. The pairing of group III elements and group IV elements can be envisoned to result in acceptor levels shallower than the first or second levels of the unpaired group IV elements occupying Se lattice sites.

In a broader sense, the coulombic pairing approach can be used to create shallow donors as well as shallow acceptors in a variety of elemental and compound semiconductors including binary, ternary and quaternary alloys.

In general, when two dopants $D^{m+}$ (standing for a donor with charge m+) and $A^{n-}$ (standing for an acceptor with charge n−) (n=m+/−1) pair because of coulombic attraction, they give rise to a center $(D^{m+}A^{n-})^+$ (n=m−1) or $(D^{m+}A^{n-})^-$ (n=m+1) whose energy levels are shallower than even the first level of the donor $D^+$; in the case of the pair $(D^{m+}A^{n-})^+$ or the first level of the acceptor A− in the case of the pair $(D^{m+}A^{n-})^-$.

One example where coulombic pairing can be used to create shallow donors has already been demonstrated in extrinsic silicon photoconductors doped with Se double donors and single acceptors B, Al and In from group III. Upon pairing, the Se double donor level reduces from 0.5 eV to 0.2 eV below the conduction band edge, a level shallower than that of even the first donor level of Se in silicon at 0.3 eV below the conductor band edge.

Another case where the coulombic approach may result in n-type material where none exists to date is that of ZnTe which exists only as p-type. With a proper choice of coulombic pairs of dopants such as elements from group I acting as single acceptors and elements from group IV acting as double donors, both sets of elements substituting Zn lattice sites could result in n-type ZnTe.

Also, coulombic pairing of elements from group IV substituting Zn lattice sites acting as double donors with elements from group V substituting Te lattice sites acting as single acceptors could potentially result in shallow donor levels in ZnTe.

It is not difficult to envision the applicability of this approach to manipulate and control the Fermi level and therewith the electronic properties of a variety of semiconductors including elemental Si and Ge and III-V , II-VI, and IV-VI compounds. The applicability of this approach to optimize the device characteristics of a variety of electrooptic and photonic devices is limitless. A few examples where its applicability can be realized include photoconductive and photovoltaic devices, LEDs, laser diodes, and photorefractive devices, etc.

THERMODYNAMICS OF COULOMBIC PAIRING

The basis for coulombic pairing is the fact that there are attractive forces which exist between ions of opposite electrical charge. In the III-V nitrides, a dopant from Group I substituting metal lattice sites in principle acts as a double acceptor whereas a dopant from Group IV substituting metal lattice sites or a dopant from Group VI substituting nitrogen lattice sites acts as a single donor.

If the acceptor states of the elements from Group I are denoted by $A^-$ and $A^{--}$ and that of the donor from Group IV or Group VI by $D^+$, the following possibilities exist for the pair formation:

1. $A^- + D^+ \rightarrow (AD)^0$ (zero superscript denotes zero or neutral charge). The mass action constant for the pairing reaction 1 is given by:

$$K_{P_1} = \frac{[(AD)^0]}{[A^-][D^+]} = K_{P_1}0\exp\left(\frac{\Delta H_{P_1}}{kT}\right)$$

where square brackets [ ] denote the concentrations.

2. $A^{--} + D^+ \rightarrow (AD)^-$

The mass action constant for the pairing reaction 2 is given by $$K_{P_2} = \frac{[(AD)^-]}{[A^-][D^+]} = K_{P_2}0\exp\left(\frac{\Delta H_{P_2}}{kT}\right)$$

It should be noted that for both reactions 1 and 2, the mass action constants governing pairing increase with decrease in temperature, meaning that the pair concentration increases with decrease in temperature.

The pairing enthalpies in the two reactions are given by:

$$\Delta H_{P_1} = \frac{z_1 z_2 q^2}{\epsilon r} = \frac{q^2}{\epsilon r}$$

Where $Z_1 = Z_2 = 1$ $$\Delta H_{P_2} = \frac{z_1 z_2 q^2}{\epsilon r} = \frac{2q^2}{\epsilon r}$$

Where $Z_1 = Z_2 = 2$ r= distance between Group I acceptor substituting a metal lattice site and a Group IV or VI donor substituting a metal or nitrogen lattice site respectively q=electronic charge z=effective charge of the ionized center ε=dielectric constant for the nitride.

It can readily be seen that the attractive forces are much stronger for the formation of the pairs $(AD)^-$ compared to that of the neutral pairs $(AD)^0$. Since $$\Delta H_{P_2} = 2\Delta H_{P_1}$$

a much higher concentration of $(AD)^-$ is to be expected.

Because of the differences in the metal-metal, metal-nitrogen, and nitrogen-nitrogen atomic distances, the enthalpy of pairing will be different for different pair combinations.

As shown in FIG. 1, it can be seen that the second level of the acceptor which may be close to the middle of the gap can essentially be brought very close to the valance band edge with pairing, just as in selenium-doped silicon (FIG. 2).

DEMONSTRATION OF THE APPLICABILITY OF THE COULOMBIC PAIRING CONCEPT TO CREATE SHALLOW ACCEPTOR LEVELS IN GaN

Coulombic pairing of dopants has been accomplished in GaN with simultaneous doping of elements from Groups I and IV via ion implantation and subsequent annealing in a nitrogen ambient. Elements chosen from Group I entailed copper and silver. Silicon was chosen as the Group IV element because of its well-established single donor behavior in GaN. The GaN films doped with these elements have been extensively characterized via Hall effect, capacitance vs. voltage (C-V), and photoluminescence (PL) measurements.

Figure 4:
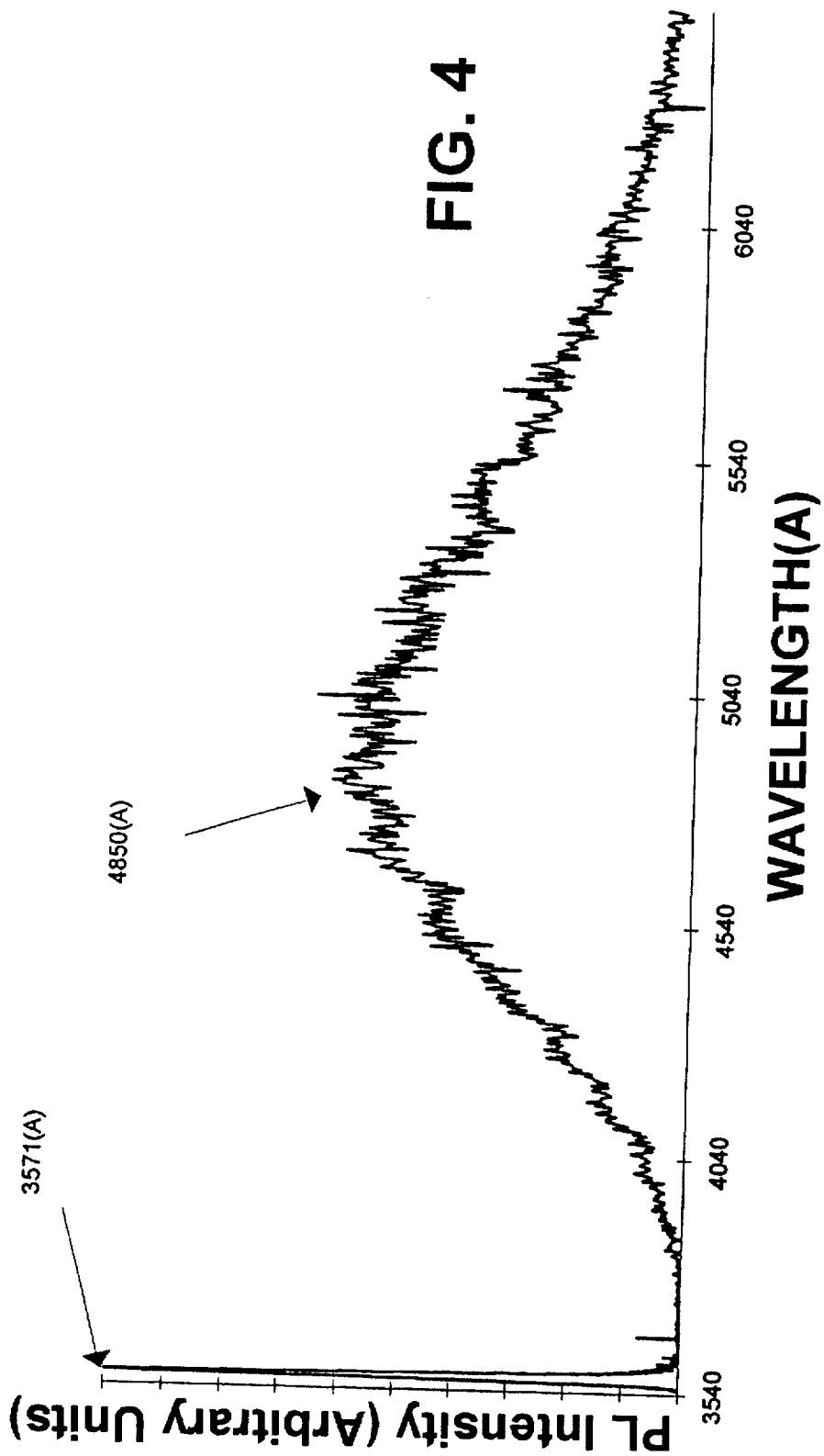
FIG. 4 is a graphical illustration of a photoluminescence spectrum of GaN without coulombic pairing.
Figure 5:
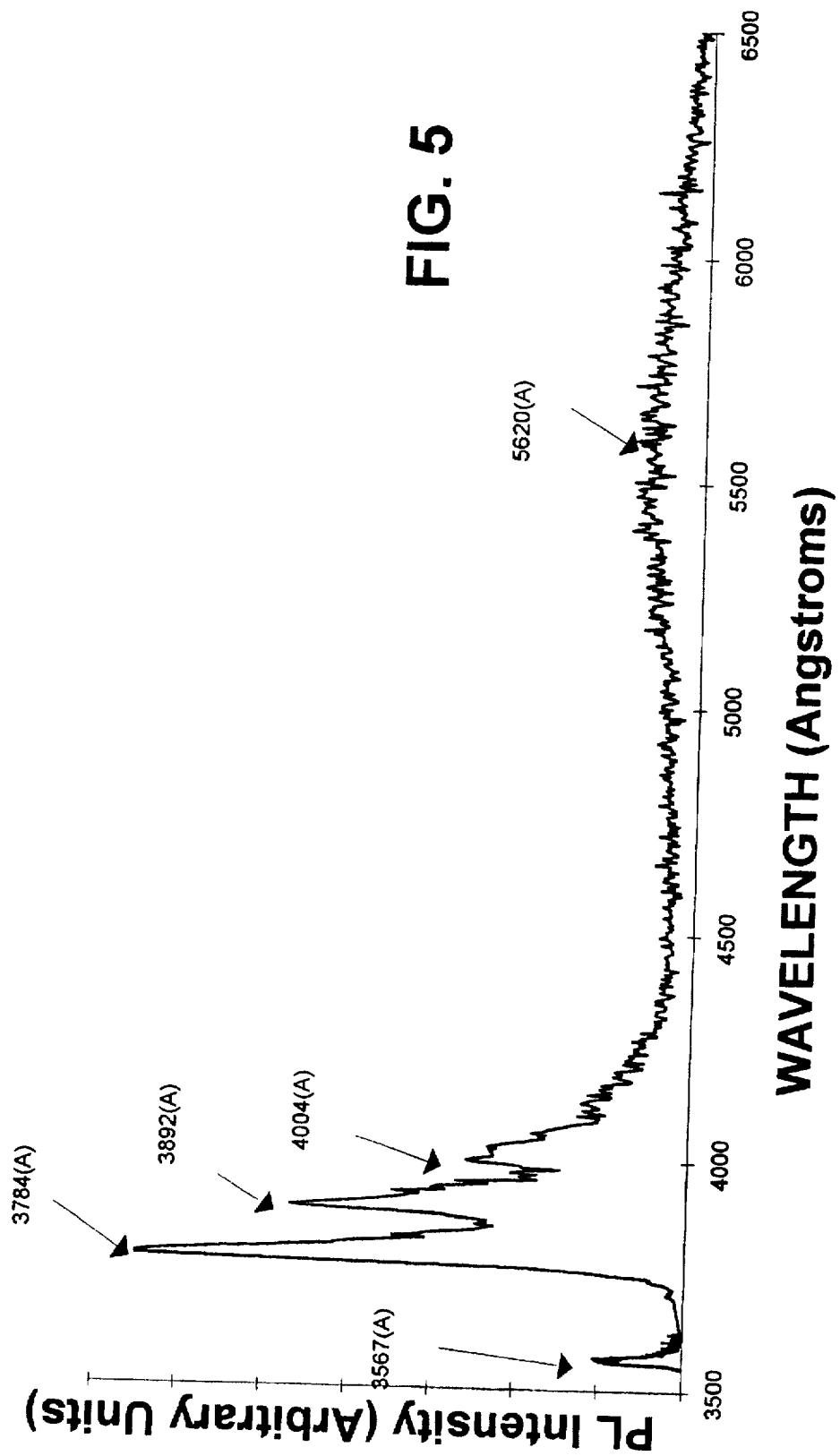
FIG. 5 is a graphical illustration of a photoluminescence spectrum of GaN with coulombic pairing.

Strong evidence for the feasibility of coulombic pairing of dopants as an approach to produce high conductivity p-type GaN and related alloys has come from the following inferences:

Observation of the Donor-Acceptor (D-A) PL peak at 3.27 eV for GaN doped with Cu+Si and Ag+Si, similar to the D-A peak one commonly encounters for Mg-doped GaN (FIG. 5). We believe the origin of the D-A peak in our samples is the realization of a shallow acceptor level because of the coulombic pairing of the doubly ionized copper and silver acceptor ions with the singly ionized silicon donors in the crystals. The D-A peak was not observed in GaN samples ion implanted with copper alone, silver alone, or silicon alone (FIG. 4).

Observation of the p-type region in the GaN samples doped with Cu+Si and Ag+Si via C-V (Capacitance-voltage) measurements.

Observation of blue light emission in a GaN sample doped with Cu+Si when current is passed between the Cu+Si implanted region and the bottom n-type region offers another indication that the implanted region is p-type.

COULOMBIC PAIRING OPTIMIZATION PARAMETERS

In order to optimize the coulombic pairing approach so that the Fermi level is as close as possible to the valence band edge, it is important to choose the best combination of elements which would give the shallowest acceptor energy level and post-growth annealing conditions such that the pair concentration is maximized and the concentration of the unpaired Group IV or Group VI donors is minimized.

OPTIMUM PAIRING ELEMENT COMBINATIONS

Based on considerations of the different covalent radii of various elements, it should be noted that the energy levels of the pairs could vary with the particular combination of Group I-Group IV and Group I-Group VI elements. In the case of silicon doped with Se double donors and single acceptors B, Ga, and Al, the donor levels of pairs of Ga—Se, B—Se, and Al—Se were essentially the same indicating that coulombic attraction rather than repulsion played a dominant role in dictating the energy levels of these pairs. However, the situation in the III-V nitrides may be different.

There are, in principle, twenty-four (24) pair combinations possible for the group of pairs from Groups I and IV. A similar number of pair combinations is possible for the group of pairs arising from the combination of elements from Group I and Group VI. Thus there exist a total of forty-eight (48) different combinations of pairs which could potentially give rise to shallow acceptor levels in the III-V nitrides. The dopant combinations are listed below:

I CATEGORY

Li, Na, K, Cu, Ag, or Au (Group I)

with Pb, Sn, Si, or Ge (Group IV)

II CATEGORY

Li, Na, K, Cu, Ag, or Au (Group I)

with O, S, Se, or Te (Group VI)

The maximum combination of the pairs which can be obtained for each combination of dopants depends on the solubility limit of the dopants. In order to obtain the highest conductivity p-type material, the Fermi level needs to be pinned at the coulombic pair level. This in turn means that the concentration of the Group I double acceptor elements should be higher than that of the Group IV or Group VI single donors.

MAXIMIZATION OF THE CONCENTRATION OF THE PAIRS

Temperature and the nitride stoichiometric conditions at which the pairs form, can affect the concentration of the pairs formed and the concentration of the pairs needs to be maximized while minimizing the concentration of unpaired Group IV and Group VI donors in order to attain the highest p-type conductivity.

TEMPERATURE OF PAIR FORMATION

The mass action constant governing the pairing equilibrium and hence the pair concentration increases with decrease in temperature. However, the diffusion coefficient of the dopants exponentially decreases with decrease in temperature. For maximum concentration of pairs to form, the temperature of pair formation has to be low enough to promote equilibrium pair concentration as high as possible. At the same time, the temperature needs to be high enough to allow for the diffusion of atoms over several atom distances for the pairs to form. It should be noted here that while we maximize the concentration of the pairs we also minimize the concentration of unpaired Group IV or Group VI donors which could act as recombination centers affecting the efficiency of LEDs and laser diodes.

NITRIDE STOICHIOMETRIC CONDITIONS

It is to be expected that Group I elements act as double acceptors occupying metal lattice sites. Group IV elements act as single donors on these same lattice sites whereas Group VI elements act as single donors occupying nitrogen lattice sites. The concentration of the Group I element acceptors and of the Group IV donors is enhanced under nitrogen rich conditions whereas the concentration of the Group VI element donors is promoted under nitrogen deficient conditions. Under nitrogen deficient conditions, a fraction of the Group I elements may also reside in interstitial sites acting as donors. Hence, it is possible that the maximum concentration of pairs may result under moderate nitrogen stoichiometric conditions rather than at the saturated or depleted nitrogen conditions.

IMPLICATIONS OF THE POTENTIAL OF THE COULOMBIC PAIRING CONCEPT FOR THE NITRIDE BASED BLUE LASERS AND LEDs

Coulombic pairing of dopants offers the potential of reducing the acceptor energy level in the nitrides to less than 50 meV compared to the value of 150 meV to 200 meV for Mg in GaN and its alloys. Such a reduction in the depth of the acceptor level would result in a nearly two orders of magnitude increase in the hole concentration. A corresponding two orders of magnitude decrease in the laser device series resistance and the laser turn-on voltage is potentially achievable. A nearly two orders of magnitude increase in hole concentration would also potentially result in a corresponding increase in the intensity of the blue LEDs. Finally, due to the much reduced compensation with coulombic pairs where the acceptor activation is expected to be orders of magnitude larger than that of Mg in GaN, much higher room temperature stimulated emission in the case of blue lasers and a much higher quantum efficiency in the case of LEDs is potentially realizable.

We provide below a discussion of the degree of acceptor ionization, increase in hole concentration, and minimization of compensation with coulombic pair acceptor level at <50 meV. With a simple analysis detailed below, we show a nearly 200 fold increase in hole concentration for an acceptor concentration of $6.5 \times 10^{19}$ cm$^-$ compared to the current technology using Mg doping.

The ionization of an acceptor with an energy level EA above the valence band edge can be written as:

$$A^0 \rightarrow A^- + h^+$$

Where
$A^0$ represents a neutral acceptor
$A^-$ represents an ionized acceptor
$h^+$ represents a hole in the valence band The mass action constant for the above reaction is given by $$K = \frac{[N_A-][h^+]}{[N_A0]} = 2\left(\frac{2\pi m_h^* kT}{h^2}\right)^{3/2} \exp\left(\frac{-E_A}{kT}\right) \quad (2)$$

where $[N_A0]$, $[N_A-]$, and $[h^+]$ denote the concentrations of each entity in cm$^{-3}$. $m_h^*$ is the effective mass of holes, h is Planck's constant, k is Boltzmann's constant, T is temperature in degrees Kelvin and $E_A$ is the energy level of the acceptor measured from the top of the valence band. For $m_h^* = 0.8$ $m_0$ $$K = \frac{[N_A-][h^+]}{[N_A0]} = 1.23 \times 10^{16} T^{3/2} \exp\left(\frac{-E_A}{kT}\right) \quad (3)$$

If the shallow acceptor concentration is much higher than the residual ionized donor concentration, $N_{D+}$, the charge balance in the crystal can be approximated by $[N_A-] \approx [h^+] \gg [N_{D+}]$.

$$K = \frac{[N_A-]^2}{[N_A0]} = 9.26 \times 10^{18} \quad (4)$$

If the total concentration of acceptors is given by $[N_A]_{Tot}$ $$[N_A]_{Tot} = [N_A-] + [N_A0] \quad (5)$$

From equation (4)

$$[N_A-]^2 = 9.26 \times 10^{18}([N_A]_{Tot} - [N_A-])$$

or $$[N_A-]^2 + 9.26 \times 10^{18}[N_A-] - 9.26 \times 10^{18}[N_A]_{Tot} = 0 \quad (6)$$

For a given $[N_A]_{Tot}$, we can solve the quadratic equation (6) to obtain the ionized acceptor concentration $[N_A-]$. For $[N_A]_{Tot} = 6.5 \times 10^{19}$ cm$^{-3}$ $[N_A-] = h^+ = 2 \times 10^{19}$ cm$^{-3}$. Or, the fractional ratio of ionized acceptor concentration to the total acceptor concentration is 0.31. This value should be compared with the experimentally measured value of $1 \times 10^{17}$ cm$^{-3}$ for the hole concentration in prior art Mg-doped GaN for a total Mg concentration of $6.5 \times 10^{19}$ cm$^{-3}$. The fractional ratio of the 300K hole concentration to the total Mg concentration in their crystals is $1.5 \times 10^{-3}$ compared to the value of 0.31 which can be obtained with a shallow acceptor at 50 meV above the valence band edge with negligible compensation, or a factor of nearly 200 fold increase in the hole concentration for the same total acceptor concentration.

EXPERIMENTAL WORK
DOPING VIA ION IMPLANTATION

For purposes of coulombic pairing, combinations of elements from Groups I and IV were chosen. Elements chosen from Group I entailed copper and silver. Silicon was chosen as the Group IV element because of its well established single donor behavior in GaN. The following ion implantations were carried out:

1) Cu
2) Cu+Si
3) Ag
4) Ag+Si

The implant dose and energy were varied for each of the elements so that the calculated dopant profiles were such that their concentrations peaked at about the same distance from the surface is to the interior of the GaN epitaxial layer. The implant doses for the donor element silicon were maintained at levels lower than those for Group I elements Cu and Ag, so that the Fermi level was always pinned at the Group I element energy level inside the forbidden gap of GaN. The implantation doses which were used corresponded to ~$10^{19}$ to $10^{20}$ cm$^{-3}$ for Cu and Ag and a factor of 3 to 4 lower for silicon.

POST-IMPLANTATION ANNEALING EXPERIMENTS

The implanted GaN epitaxial layers were sealed in quartz ampoules and backfilled with $N_2$ gas such that the $N_2$ pressure at 300° K. was between ⅓ and ½ atmosphere. The samples were annealed at temperatures ranging from 600 degrees Celsius to 1200 degrees Celsius for times ranging from less than an hour to over 500 hours.

CHARACTERIZATION OF THE GaN EPITAXIAL LAYERS

The GaN epitaxial layers were characterized via Hall effect, C-V, and photoluminescence measurements. Indium was used as the ohmic contact for Hall effect measurements. Aluminum dots were used for the field plates in C-V measurements.

All the photoluminescence (PL) measurements were carried out at 10K using UV excitation from an Argon ion laser. The total laser power was set at 10 mW with the power incident on the samples being less than this value. The PL spectra were collected and analyzed using a SPEX double pass monochromator and detected using a GaAs photocathode. The signal was amplified using a lock-in amplifier and was stored using an IBM PC-compatible computer.

RESULTS AND DISCUSSION

A large number of anneals were carried out on GaN epitaxial layers which were as grown, Cu implanted, Ag implanted, Si implanted, (Cu+Si) implanted, and (Ag+Si) implanted.

We compare the results of electrical measurements and PL spectra to deduce inferences on the feasibility of achieving high conductivity p-type GaN using the approach of coulombic pairing. Inferences from the electrical and C-V data will be presented, followed by a discussion of the PL spectra results. All these results are then correlated in conjunction with observation of blue light emission—in (Cu+Si) ion implanted and annealed samples—to demonstrate the feasibility of the coulombic pairing of dopants as an approach to produce high conductivity p-type GaN.

ELECTRICAL DATA ON UNDOPED, UNIMPLANTED GaN EPITAXIAL LAYERS

As can be seen from the electrical results summarized in TABLE 1, the undoped as-grown epitaxial layers and undoped layers which were annealed at temperatures ranging from 700 degrees Celsius to 1100 degrees Celsius at $N_2$ (g) pressures ranging from $10^{-2}$ to 1 atmosphere showed 300° K. electron concentrations from $5\times10^{17}$ to $9\times10^{17}$ cm$^{-3}$.

ELECTRICAL DATA (HALL EFFECT AND CAPACITANCE vs. VOLTAGE) IN DOPED GaN EPITAXIAL LAYERS

In the case of ion implantation doped GaN epitaxial layers, it should be borne in mind that the doped layer is very thin and even if it is p-type, the fact that the underlying layer is n-type with ~$9\times10^{17}$ cm$^{-3}$ electron concentration, the n-type conductivity would dominate, making the evaluation of p-type carrier concentration very difficult.

GaN epitaxial layers ion implanted with Si, Cu, Ag, Cu+Si, and Ag+Si all showed n-type conductivity with ~$10^{17}$ to $10^{18}$ cm$^{-3}$ carrier concentration, without any anneal (see TABLE 1). However, samples of GaN ion implanted with Cu+Si and Ag+Si showed insulating behavior after anneals in excess of 1050 degrees C and C-V measurements on samples ion implanted with Cu+Si and Ag+Si annealed at 1050 degrees C for 30 minutes and at 1000 degrees C for five hours showed p-type behavior with ~$10^{16}$ to $10^{18}$ cm$^{-3}$ hole concentration.

TABLE 1

Summary of Anneals on the GaN epitaxial layers along with electrical characteristics

| | | 300K electrical characteristics | |
|---|---|---|---|
| Sample # | Dopant and details of anneal (temperature, partial pressure of nitrogen) | carrier type and concentration (in cm$^{-3}$) | carrier mobility (cm$^2$/V-sec) |
| 1 | as-grown | n-type, $8.6 \times 10^{17}$ | 48 |
| 2 | undoped, 800° C., 0.01 atm., 3 days | n-type, $1.4 \times 10^{18}$ | 34 |
| 3 | undoped, 800° C., 0.1 atm., 3 days | n-type, $6.7 \times 10^{17}$ | 54 |
| 4 | undoped, 800° C., 1.0 atm., 3 days | n-type, $5.1 \times 10^{17}$ | 59 |
| 5 | undoped, 1000° C., 1.0 atm., 3 days | n-type, $6.8 \times 10^{17}$ | 63 |
| 6 | copper, as-implanted | n-type, $1.2 \times 10^{17}$ | 21 |
| 7 | silver, as-implanted | n-type, $1.1 \times 10^{18}$ | 16 |
| 8 | (copper + silicon) as-implanted | n-type, $1.2 \times 10^{18}$ | 21 |
| 9 | (silver + silicon) as-implanted | n-type, $1.1 \times 10^{18}$ | 16 |
| 10 | copper, 1100° C., 1.0 atm., 1 hr + 700° C., 1.0 atm., 11 days | n-type, $2.1 \times 10^{17}$ | 96 |
| 11 | silver, 1100° C., 1.0 atm., 1 hr + 700° C., 1.0 atm., 11 days | n-type, $7.0 \times 10^{16}$ | 116 |
| 12 | silicon, 1100° C., 1.0 atm., 1 hr + 700° C., 1.0 atm., 11 days | n-type, $2.0 \times 10^{18}$ | 68 |
| 13 | (copper + silicon), 1050° C., 1.0 atm., 30 min. + 1000° C., 1.0 atm., 5 hours | p-type, $10^{16}$ to $10^{18}$ (C-V data) | |
| 14 | (copper + silicon), 1080° C., 1.0 atm., 1.5 hrs. + 700° C., 1.0 atm., 18 hours + 500° C., 1.0 atm., 14 days | p-type (C-V data) | |
| 15 | (silver + silicon), 1050° C., 1.0 atm., 30 min. + 1000° C., 1.0 atm., 5 hours | p-type, $10^{16}$ to $10^{18}$ (C-V data) | |

PHOTOLUMINESCENCE (PL) RESULTS

TABLE 2 provides a summary of the PL results on all the GaN samples investigated to-date.

UNDOPED CRYSTALS

FIG. 4, showing the PL spectra of undoped GaN epitaxial layers, indicates two emission regions. The emission around 3.47 eV corresponds to the excitonic recombination. The highest emission peak at 3.472 eV corresponds to the bound excitonic recombination with the ionized donor. The origin of the donor impurity cannot be identified since several donors have similar ionization energies. A deep level emission around 2.2 to 2.5 eV is generally observed in all undoped GaN layers. This level is probably related to some impurity defect complex and is also present in all our ion implanted samples. Literature shows this level to be absent in GaN epitaxial layers grown on bulk GaN, suggesting that the level may also be related to the presence of some structural defect such as interface dislocations arising from the mismatch of lattice between GaN and the underlying sapphire substrate. Another region around 3.26 eV contains no emission peak, indicating that the undoped layer is n-type and the presence of acceptors is negligibly small in the undoped GaN layers. In fact, Hall measurements show the undoped layers to be n-type with 300° K. carrier concentration of $9\times10^{17}$ cm$^{-3}$ and mobility of 48 cm$^2$ V-sec (TABLE 1).

All the undoped GaN samples annealed at various temperatures and $N_2$ pressure ambients show in general the same PL features as that of the undoped, unannealed GaN sample shown in FIG. 4 (see TABLE 2 for details).

GaN ION IMPLANTED ONLY WITH Cu, Ag, or Si

As mentioned earlier, in our investigation we used Group I elements Cu and Ag as the double acceptors and Si from Group IV as the single donor occupying Ga lattice sites.

As can be seen from the summary of PL results in TABLE 2, the PL spectra obtained by us for GaN samples implanted with Cu, Ag, or Si alone show no characteristic features except a weak emission at 2.2 eV defect band.

TABLE 2

Summary of Photoluminescence Spectra Results at 10K for various GaN epitaxial layers doped with Cu, Ag, Si, and their combinations after anneals at various temperatures

| Sample | Dopant and details of anneal (temperature, partial pressure of nitrogen) | PL spectral results (see captions below) |
|---|---|---|
| 1 | as-grown | Defect related |
| 2 | undoped, 800° C., 0.01 atm., 3 days | Defect related |
| 3 | undoped, 800° C., 0.1 atm., 3 days | Defect related |
| 16 | undoped, 600° C., 0.01 atm., 18 days | Defect related |
| 17 | undoped, 600° C., 0.1 atm., 18 days | Defect related |
| 18 | undoped, 600° C., 1.0 atm., 18 days | Defect related |
| 10 | copper, 1100° C., 1.0 atm., 1 hr + 700° C., 1.0 atm., 11 days | Defect related |
| 12 | silcon, 1100° C., 1.0 atm., 1 hr + 700° C., 1.0 atm., 11 days | Defect related |
| 19 | (copper + silicon), 800° C., 1.0 atm., 12 days | Defect related |
| 20 | (silver + silicon), 800° C., 1.0 atm., 12 days | Defect related |
| 21 | copper, 800° C., 1.0 atm., 19 hours | Defect related |
| 22 | (silver + silicon), 1200° C., 1.0 atm., 45 min. | Donor-Acceptor (D-A) |
| 13 | (copper + silicon), 1050° C., 1.0 atm., 30 min. + 1000° C., 1.0 atm., 5 hours | Donor-Acceptor (D-A) |
| 15 | (silver + silicon), 1050° C., 1.0 atm., 30 min. + 1000° C., 1.0 atm., 5 hours | Donor-Acceptor (D-A) |
| 23 | (silver + silicon), 1100° C., 1.0 atm., 19 hours | Donor-Acceptor (D-A) |

Defect related: means emission at 2.21–2.5 eV
Donor-Acceptor (D-A): means emission peak at 3.27 eV followed by LO phonon replicas at 3.18 eV, 3.09 eV, and 2.99 eV GaN CO-IMPLANTED WITH Cu+Si AND Ag+Si FIG. 5 shows the PL spectra of GaN samples ion implanted with Cu+Si and Ag+Si and annealed at temperatures in excess of 1050 degrees C. The spectacular difference when the samples are co-implanted and annealed at T>1050 degrees C is evident from the PL spectra shown in this figure. These samples show a new emission region identified as the Donor-Acceptor (D-A) region and contains a series of peaks. The primary peak appears at 3.27 eV followed by LO phonon replicas peaking at 90 meV apart. This region shows the characteristics of D-A pair emission, emission from electron bound to the donor with holes in the acceptor. This is the first time one has demonstrated the appearance of the 3.27 eV band after co-implantation and annealing. Magnesium is the only other element which, after ion implantation and annealing, has given the 3.27 eV band. The facts that:

1) the D-A peak band of 3.27 eV, almost identical to that of Mg in GaN, appears only in co-implanted (Cu+Si and Ag+Si) GaN samples annealed at T>1050 degrees C; and 2) this band is absent in samples doped only with Cu, Ag, or Si, clearly demonstrate that Cu an Si, as well as Ag and Si, coulombically pair to form shallow single acceptor levels (FIG. 1) which then give rise to the D-A emission peak at 3.27 eV.

BLUE EMISSION FROM GaN SAMPLES WITH COULOMBIC PAIRS

Based on the indication of the presence of a shallow acceptor level—because of the coulombic pairing—as well as evidence of the p-type nature of the implanted layer from C-V measurements, we undertook to investigate a GaN sample coulombically doped with Cu+Si and annealed at T>1050 degrees C. When a current was passed between the implanted region and the bottom n-type region, we observed a blue light emission, indicating that the co-implanted/ annealed region is p-type. This is additional strong evidence for the p-type conductivity as a result of the coulombic pairing of Cu and Si.

Those having skill in the relevant art will now, as a result of the disclosure herein, perceive various modifications and additions which may be made to the invention. The combination of dopants from groups I and IV, as well as from groups I and VI, required for coulombic pairing can be incorporated in the nitride layers during epitaxial growth of the multiple heterostructures and quantum well structures from metallo-organic chemical vapor deposition (MOCVD) or molecular beam epitaxy (MBE) techniques. Other growth techniques and methods of introduction such as ion implantation, which has been used to demonstrate the concept, also can facilitate the incorporation of these combinations of dopants. Also by way of example, the use of coulombic pairing for doping other semiconductor materials will now occur to those having the benefit of this disclosure. Furthermore, the precise steps that may better promote acceptor/donor pairing and achieve enhanced benefits of high doping concentrations, may prove to be acceptable modifications of or improvements over those steps disclosed herein based upon what is known currently.

Accordingly, all such modifications, additions and improvements are deemed to be within the scope of the invention which is to be limited only by the appended claims and their equivalents.

I claim:

1. A III-V semiconductor material doped with a material comprising an acceptor element from group I and donor element from groups IV and VI, the acceptor element having a double valence and the donor element having a single valence, the acceptor and donor elements having been paired coulombically to provide single valence acceptor pairs to dope said semiconductor material.

2. The doped III-V semiconductor material recited in claim 1 wherein said material is taken from the group consisting of GaN, InN, AlN and alloys thereof.

3. A III-V nitride semiconductor doped with a material comprising an acceptor element from group I and donor element from groups IV and VI, the acceptor element having a double valence and the donor element having a single valence, the acceptor and donor elements having been paired coulombically to provide single valence acceptor pairs to dope said nitride semiconductor.

4. The p-doped III-V nitride semiconductor recited in claim 3 wherein said semiconductor is taken from the group consisting of GaN, InN, AlN and alloys thereof.

5. A III-V semiconductor material p-doped with coulombic pairs of first and second elements, the first element taken from the group of elements consisting of Li, Na, K, Cu, Ag and Au; the second element taken from the group of elements consisting of Pb, Sn, Si, Ge, O, S, Se and Te.

6. The doped III-V semiconductor material recited in claim 5 wherein said material is taken from the group consisting of GaN, InN, AlN and alloys thereof.

7. A III-V nitride semiconductor p-doped with coulombic pairs of first and second elements, the first element taken from the group of elements consisting of Li, Na, K, Cu, Ag and Au; the second element taken from the group of elements consisting of Pb, Sn, Si, Ge, O, S, Se and Te.

8. The p-doped III-V nitride semiconductor recited in claim 7 wherein said semiconductor is taken from the group consisting of GaN, InN, AlN and alloys thereof.

9. A light emitting semiconductor device fabricated from a III-V material and being doped with a concentration of coulombic pairs of elements comprising an element from group I and an element from group IV or group VI.

10. The light emitting semiconductor device recited in claim 9 wherein said III-V material comprises a nitride.

11. The light emitting semiconductor device recited in claim 10 wherein said nitride is GaN.

12. The light emitting semiconductor device recited in claim 10 wherein said nitride is AlN.

13. The light emitting semiconductor device recited in claim 10 wherein said nitride is InN.

14. The light emitting semiconductor device recited in claim 10 wherein said nitride comprises alloys of GaN and at least one other nitride.

15. A blue-light emitting p-doped GaN semiconductor device having a dopant formed from a concentration of coulombic pairs of elements comprising an element from group I and an element from group IV or group VI, each said coulombic pair exhibiting a single valence of an acceptor ion.

* * * * *